United States Patent
Hammond et al.

(10) Patent No.: US 6,768,096 B2
(45) Date of Patent: Jul. 27, 2004

(54) PASSIVE THERMAL STABILIZATION OF WAVELENGTH MONITOR

(75) Inventors: John Barnett Hammond, Charlotte, NC (US); Bingzhi Su, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 0 days.

(21) Appl. No.: 10/060,097

(22) Filed: Jan. 31, 2002

(65) Prior Publication Data

US 2003/0141438 A1 Jul. 31, 2003

(51) Int. Cl.[7] ................................................. G01J 3/50
(52) U.S. Cl. ...................... 250/226; 250/238; 356/416
(58) Field of Search ................................. 250/216, 239, 250/226, 238; 356/402–425

(56) References Cited

U.S. PATENT DOCUMENTS

| 4,309,671 | A | | 1/1982 | Malyon |
| 4,678,904 | A | * | 7/1987 | Saaski et al. ............ 250/227.27 |
| 4,687,335 | A | * | 8/1987 | Zupanick et al. ............ 356/416 |
| 4,993,032 | A | | 2/1991 | Bradley |
| 6,101,200 | A | | 8/2000 | Burbidge et al. |
| 6,169,280 | B1 | * | 1/2001 | Bawolek et al. ........... 250/208.1 |
| 6,243,403 | B1 | * | 6/2001 | Broutin et al. .............. 372/32 |
| 6,477,190 | B1 | * | 11/2002 | Komiyama et al. ............ 372/34 |

* cited by examiner

Primary Examiner—David Porta
Assistant Examiner—Patrick J. Lee
(74) Attorney, Agent, or Firm—Susan S. Morse

(57) ABSTRACT

Passive thermal stabilization of a wavelength monitor includes shielding a wavelength dependent filter of the wavelength monitor from ambient cavity temperatures with portions extending from a submount supporting detectors for the wavelength monitor. The portions and the submount may constitute a single piece, or may be multiple pieces. The shield covers at least one surface of the wavelength dependent filter. The shield may include electrical interconnections for the detectors. A temperature detector may be provided on the submount or the shield portions. The submount or shield portions may be modeled and/or designed to have a section that tracks the thermal response of the wavelength dependent filter and the temperature detector may be mounted on that section.

15 Claims, 2 Drawing Sheets

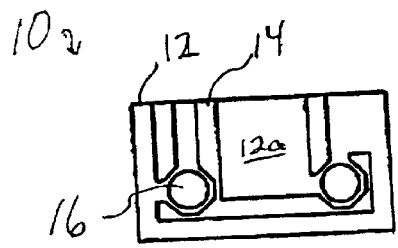
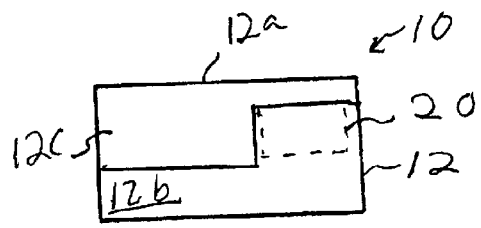
FIG. 1A  FIG. 1B
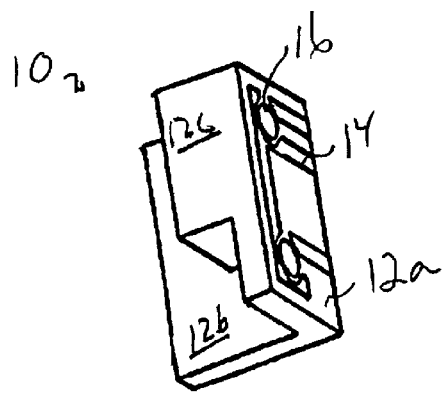
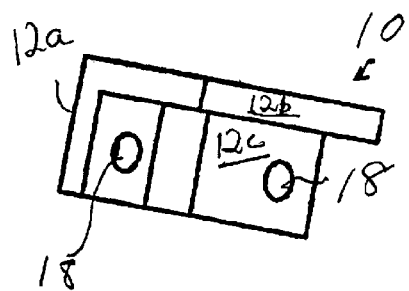
FIG. 1C  FIG. 1D
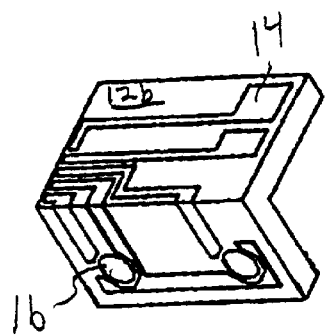
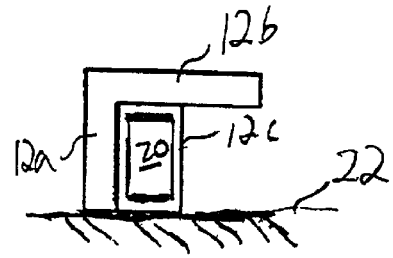
FIG. 1E  FIG. 1F

PASSIVE THERMAL STABILIZATION OF WAVELENGTH MONITOR

FIELD OF THE INVENTION

The present invention is directed to passive thermal stabilization of a wavelength monitor, i.e., making the wavelength monitor less sensitive to variations in ambient cavity temperatures, without feeding back this information to the light source being monitored itself. In particular, the present invention is directed to providing a shield and/or a temperature control for a wavelength dependent filter of a wavelength monitor.

BACKGROUND OF THE RELATED ART

In telecommunications, it is often desirable to stabilize light emitting devices against drift in emission wavelength. These drifts can occur due to current fluctuations, age, and temperature. The current supplied to the light emitting devices can be controlled using wavelength lockers, including wavelength dependent elements such as a Fabry-Perot etalon, to determine an output wavelength. However, typically these wavelength dependent elements are also sensitive to thermal variations. Thus, unless the temperature of the wavelength dependent element is controlled, the characteristics of the wavelength locker vary significantly in accordance with the temperature and the wavelength cannot be adequately stabilized.

Current solutions to controlling the temperature in wavelength lockers include active thermal compensation and material index compensation. Active thermal compensation typically involves detecting the temperature and using the detected temperature to control the wavelength or to adjust the temperature of the light emitting device itself using a heater/cooler. This solution requires more active elements and increased processing. Material index compensation typically involves using optical elements fabricated of different materials having equal and opposite index-temperature coefficients or of materials having little or no net change in index-temperature coefficient. However, these materials are wavelength dependent, so they are not reliable over a large wavelength range.

SUMMARY OF THE PRESENT INVENTION

The present invention is therefore directed to a passive thermal stabilization of a wavelength monitor which substantially overcomes one or more of the problems due to the limitations and disadvantages of the related art.

It is an object of the present invention to minimize the effect of ambient cavity temperatures on the wavelength monitor. It is a further object of the present invention to effectively control the temperature of the wavelength monitor.

At least one of the above and other objects may be realized by providing an optical sub-assembly for use with a wavelength monitor including a submount on which two detectors are to be provided, a wavelength dependent filter mounted adjacent to one of the two detectors, and a shield portion extending from the submount over the wavelength dependent filter.

The submount and the shield portion extending therefrom may a single piece. The shield portion may extend over at least two surfaces of the wavelength dependent interference filter. The wavelength dependent filter may be an etalon. The optical sub-assembly may include a substrate on which the submount is mounted. The wavelength dependent filter may be mounted on the substrate. The shield portion may extend in an optical path of a detector, the shield portion having a hole in the optical path of the detector. The shield portion may be coextensive with an edge of the submount. The optical sub-assembly may include electrical interconnection tracks for the detectors, the electrical interconnection tracks extending along the shield portion.

The optical sub-assembly may include a mimicking element having thermal characteristics matched to that of the wavelength dependent filter. A temperature detector may be on the mimicking element. A thermal adjuster adjusting the temperature of the wavelength dependent filter controlled by the temperature detector may be included. The wavelength dependent filter may be mounted directly on the thermal adjuster. The optical sub-assembly may include a substrate, with the wavelength dependent filter is mounted on one side of the substrate and the thermal adjuster mounted on an opposite side of the substrate.

The optical sub-assembly may include a temperature detector mounted on one of the submount and the shield portion. A thermal adjuster adjusting the temperature of the wavelength dependent filter controlled by the temperature detector may be included. The temperature detector may be mounted on a section of one of the submount and the shield portion that most closely matches the thermal response of the wavelength dependent filter.

At least one of the above and other objects may be realized by providing an optical sub-assembly for use with a wavelength monitor including a wavelength dependent filter, a mimicking element having thermal characteristics matched to that of the wavelength dependent interference filter and subject to similar thermal conditions as the wavelength dependent filter, a temperature detector on the mimicking element, and a thermal adjuster controlled by the temperature detector, the thermal adjuster adjusting a temperature of the wavelength dependent filter.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIG. 1A is a schematic side view of an optical sub-assembly of the present invention;

FIG. 1B is a schematic bottom view of the optical sub-assembly of FIG. 1A;

FIG. 1C is a schematic elevational perspective bottom view of the optical sub-assembly of FIG. 1A;

FIG. 1D is a schematic elevational perspective side view of the optical sub-assembly of FIG. 1A;

FIG. 1E is a schematic elevational perspective top view of the optical sub-assembly of FIG. 1A;

FIG. 1F is a side view of the optical sub-assembly of FIG. 1A mounted on a substrate;

DETAILED DESCRIPTION

Figure 2A:
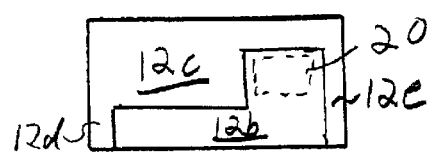
FIG. 2A is a schematic bottom view of a second optical subassembly of the present invention.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Throughout the drawings, the same reference numerals denote the same elements.

Conventional component based assembly techniques for wavelength lockers result in all the components being exposed to the atmospheric temperature of the cavity. In accordance with the present invention, shielding and/or more accurate temperature control of the wavelength dependent filter can result in improved thermal performance. The signals detected in a wavelength monitor including an optical sub-assembly in accordance with the present invention may be used to control a light source being monitored in accordance with known techniques.

FIGS. 1A–1F illustrate various views of a first optical sub-assembly 10 of the present invention. As seen in the side view of FIG. 1A, the optical sub-assembly 10 includes a carrier 12, electrical interconnection tracks 14 and detectors 16. The detectors 16 are provided on a submount portion 12a of the carrier 12. FIG. 1B illustrates a bottom view of the optical sub-assembly 10. As can be seen therein, the carrier 12 includes a shelf portion 12b extending out from a top edge of the submount portion 12a and a stepped portion 12c extending from part of a bottom edge of the submount portion 12a. FIG. 1C more clearly illustrates the relationship between the different portions 12a–12c of the carrier 12. FIG. 1D is a perspective side view of a side opposite that shown in FIG. 1A. As can be seen therein, the carrier 12 has holes 18 allowing passage of light through the carrier 12 to the detectors 16. FIG. 1E is a perspective top view further showing the electrical interconnection tracks 14 for the detectors 16. As shown therein, the electrical interconnections 14 are continued on the shelf portion 12b.

As can be seen in outline form in FIG. 1B, a wavelength dependent filter 20, e.g., an etalon, a notch filter, a dielectric thin film stack, etc., is to be mounted next to the stepped portion 12c. FIG. 1F illustrates the optical sub-assembly 10 with the wavelength dependent filter 20 mounted on a substrate 22.

The wavelength dependent filter 20 may be attached to the carrier 12 or to the substrate 22. The substrate 22 may also support optical elements for directing light from a light source to the detectors 16 and/or the light source itself. As can be seen in FIGS. 1A–1F, the shelf portion 12b and the stepped portion 12c help to shield the wavelength dependent filter 20 from the ambient package environment.

For serving as a temperature shield, the carrier 12 needs to be thermally conductive. For serving as a submount for the detectors 16 and for providing the interconnection tracks 14, the carrier 12 needs to be electrically insulating. The carrier 12 may be made of ceramic, alumina, or aluminum nitride. If the carrier 12 is a single piece, the thermally conductivity thereof may be enhanced by providing highly conductive material on portions that will not interfere with the functioning of the detectors 16. If the carrier is more than one piece, different materials may be used for the different portions. For example, if the eletrical interconnection tracks 14 are provided on the stepped portion 12c, the shelf portion 12b could be highly conductive. However, the shelf portion 12c provides more room for the electrical interconnection tracks 14.

Figure 2B:
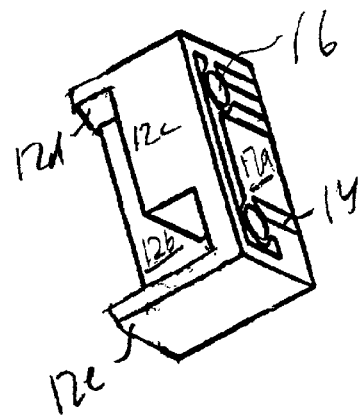
FIG. 2B is a schematic elevational perspective bottom view of the optical sub-assembly of FIG. 2A.

FIGS. 2A–2B illustrate a second embodiment of the optical sub-assembly of the present invention providing further shielding to the wavelength dependent filter. As shown therein, portions 12d and 12e of the carrier 12 extend along the shelf portion 12b, further protecting the wavelength dependent filter 20 from the ambient package environment. When the carrier 12 is mounted with a substrate, as in FIG. 1F, the wavelength dependent filter 20 will be enclosed.

Figure 3:
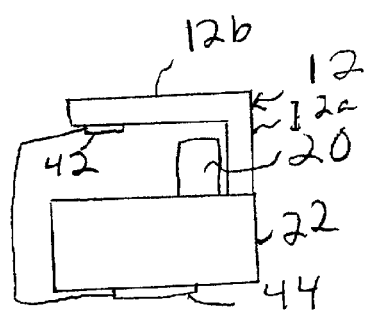
FIG. 3 is a schematic side view of a third optical sub-assembly of the present invention.

A third embodiment of the optical sub-assembly of the present invention is shown in FIG. 3. As shown in the side view of FIG. 3, the carrier 12 includes the submount portion 12a for detectors and the shelf portion 12b, which both provides electrical interconnection tracks for the detector and acts as a shield for the wavelength dependent filter 20, as in the previous embodiments. Here the extension, i.e., the shelf portion 12b, from the submount 12a only extends along one surface of the wavelength dependent filter 20. This is in contrast to the first embodiment in which extensions from the submount 12a extended along two sides of the wavelength dependent filter 20 and to the second embodiment in which extensions from the submount 12a extended along three sides of the wavelength dependent filter 20.

By using any of the above shielding configurations, the thermal gradient through the wavelength dependent filter 20 can be dramatically limited. This thermal stability may be improved by providing a temperature detector 42 somewhere on the carrier 12, as shown in FIG. 3. The temperature is then provided to a thermal adjuster 44, e.g., a thermoelectric cooler, which adjusts the temperature of the substrate 22 on which the wavelength dependent filter 20 is mounted. Alternatively, the wavelength dependent filter 20 may be mounted directly on the thermal adjuster 44. For more accurate temperature control, the carrier 12 may be modeled and/or designed such that the detector 42 may be mounted on a region of the carrier 12 which most closely reflects the thermal response of the wavelength dependent filter 20.

Figure 4:
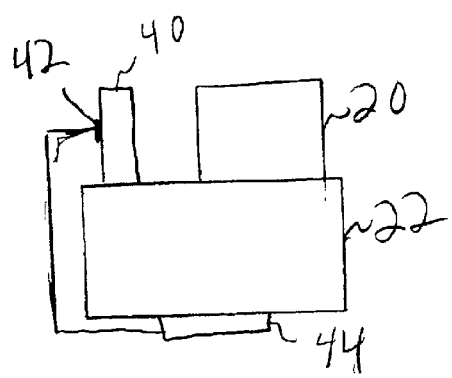
FIG. 4 is a schematic side view of a fourth optical sub-assembly of the present invention.

A fourth embodiment of the optical sub-assembly of the present invention is shown in FIG. 4. Here, rather than a physical shield, a mimicking element 40 is provided, here on the substrate 22, in a similar thermal environment as the wavelength dependent filter 20. The thermal gradient across the mimicking element 40 is matched to that of the wavelength dependent filter 20. The temperature detector 42, such as a thermistor, is mounted on the mimicking element 40. Since the temperature detector 42 is mounted directly on the mimicking element 40, rather than just near the wavelength dependent filter 20, accurate monitoring of the wavelength dependent filter's temperature can be realized. Rather than feeding back the temperature information along with the data from the detectors 16 to control the light source, the temperature of the wavelength dependent filter itself is stabilized. As shown herein, this thermal stability is achieved using the thermal adjuster 44 for adjusting the temperature of the substrate 22 on which the wavelength dependent filter 20 is mounted.

Alternatively, the wavelength dependent filter 20 may be mounted directly on the thermal control 44. The thermal adjuster 44 is controlled by the output of the temperature detector 42. Without the shielding of the previous embodiments, the temperature of the wavelength dependent filter 20 can still vary, e.g., by 5°, while with the shielding the temperature variations may be less than 1°, making adjustment of the temperature easier.

While the present invention is described herein with reference to illustrative embodiments for particular applications, it should be understood that the present invention is not limited thereto. For example, the shielding does not have to be integral with the carrier, but may be a separate piece attached thereto. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

What is claimed is:

1. An optical sub-assembly for use with a wavelength monitor comprising:
   a submount on which two detectors are to be provided;
   a wavelength dependent filter mounted adjacent to one of the two detectors;
   a mimicking element having thermal characteristics matched to that of the wavelength dependent filter and subject to similar thermal conditions as the wavelength dependent filter;
   a temperature detector on the mimicking element; and
   a shield portion extending from the submount over the wavelength dependent filter.

2. The optical sub-assembly as recited in claim 1, wherein the submount and the shield portion extending therefrom are a single piece.

3. The optical sub-assembly as recited in claim 1, wherein the shield portion extends over at least two surfaces of the wavelength dependent interference filter.

4. The optical sub-assembly as recited in claim 1, wherein the wavelength dependent filter is an etalon.

5. The optical sub-assembly as recited in claim 1, further comprising a substrate on which the submount is mounted.

6. The optical sub-assembly as recited in claim 5, wherein the wavelength dependent filter is mounted on the substrate.

7. The optical sub-assembly as recited in claim 1, further comprising a thermal adjuster controlled by the temperature detector, the thermal adjuster adjusting the temperature of the wavelength dependent filter.

8. The optical sub-assembly as recited in claim 7, wherein the wavelength dependent filter is mounted directly on the thermal adjuster.

9. The optical sub-assembly as recited in claim 7, further comprising a substrate, wherein the wavelength dependent filter is mounted on one side of the substrate and the thermal adjuster is mounted on an opposite side of the substrate.

10. The optical sub-assembly as recited in claim 1, wherein the shield portion extends in an optical path of a detector, further comprising a hole in the shield portion in the optical path of the detector.

11. The optical sub-assembly as recited in claim 1, wherein the shield portion is co-extensive with an edge of the submount.

12. The optical sub-assembly as recited in claim 1, further comprising electrical interconnection tracks for the detectors, the electrical interconnection tracks extending along the shield portion.

13. An optical sub-assembly for use with a wavelength monitor comprising:
    a wavelength dependent filter;
    a mimicking element having thermal characteristics matched to that of the wavelength dependent filter and subject to similar thermal conditions as the wavelength dependent filter;
    a temperature detector on the mimicking element; and
    a thermal adjuster controlled by the temperature detector, the thermal adjuster adjusting a temperature of the wavelength dependent filter.

14. The optical sub-assembly as recited in claim 13, wherein the wavelength dependent filter is on the thermal adjuster.

15. The optical sub-assembly as recited in claim 13, further comprising a substrate between the wavelength dependent filter and the thermal adjuster.

* * * * *